United States Patent [19]
Tandon et al.

[11] Patent Number: 5,153,421
[45] Date of Patent: Oct. 6, 1992

[54] ARCHITECTURE FOR ANALOG AND DIGITAL IMAGE SENSOR ARRAYS

[75] Inventors: Jagdish C. Tandon, Fairport; Scott L. Tewinkle, Ontario; David J. Metcalfe, Marion; YungRan Choi, Webster; Richard B. Eaton, Rochester, all of N.Y.

[73] Assignee: Xerox Corporation, Stamford, Conn.

[21] Appl. No.: 787,337

[22] Filed: Nov. 4, 1991

[51] Int. Cl.$^5$ .............................................. H01J 40/14
[52] U.S. Cl. ............................ 250/208.1; 358/213.16
[58] Field of Search ................... 250/208.1, 211 R; 357/30 D, 30 E, 30 H, 30 G; 358/213.16; 382/50, 54

[56] References Cited

U.S. PATENT DOCUMENTS

| | | | |
|---|---|---|---|
| 4,174,528 | 11/1979 | White | 358/280 |
| 4,281,254 | 7/1981 | Seachman | 250/578 |
| 4,491,964 | 1/1985 | Sanner | 382/50 |
| 4,544,848 | 10/1985 | Kawasaki et al. | 250/578 |
| 4,644,411 | 2/1987 | Sato et al. | 250/208.1 |
| 4,684,991 | 8/1987 | Forchheimer et al. | 358/213.11 |
| 4,734,589 | 3/1988 | Atherton | 250/578 |
| 4,914,311 | 4/1990 | Kinoshita et al. | 250/578.1 |
| 4,987,295 | 1/1991 | Kinnard et al. | 250/208.1 |

Primary Examiner—David C. Nelms
Assistant Examiner—K. Shami
Attorney, Agent, or Firm—F. E. McMullen

[57] ABSTRACT

Sensor array architectures for both analog and digital sensor arrays adapted for single chip applications or abutment with other like arrays to form a composite scanning array, the architecture providing a sensor array in which the array video signal processing circuits, clock circuits, etc. are integrated onto the same chip as the sensor array itself and dark reference sensors are located in-line or apart from the image scanning sensors to avoid gaps in the scan line when several sensor arrays are assembled together.

23 Claims, 6 Drawing Sheets

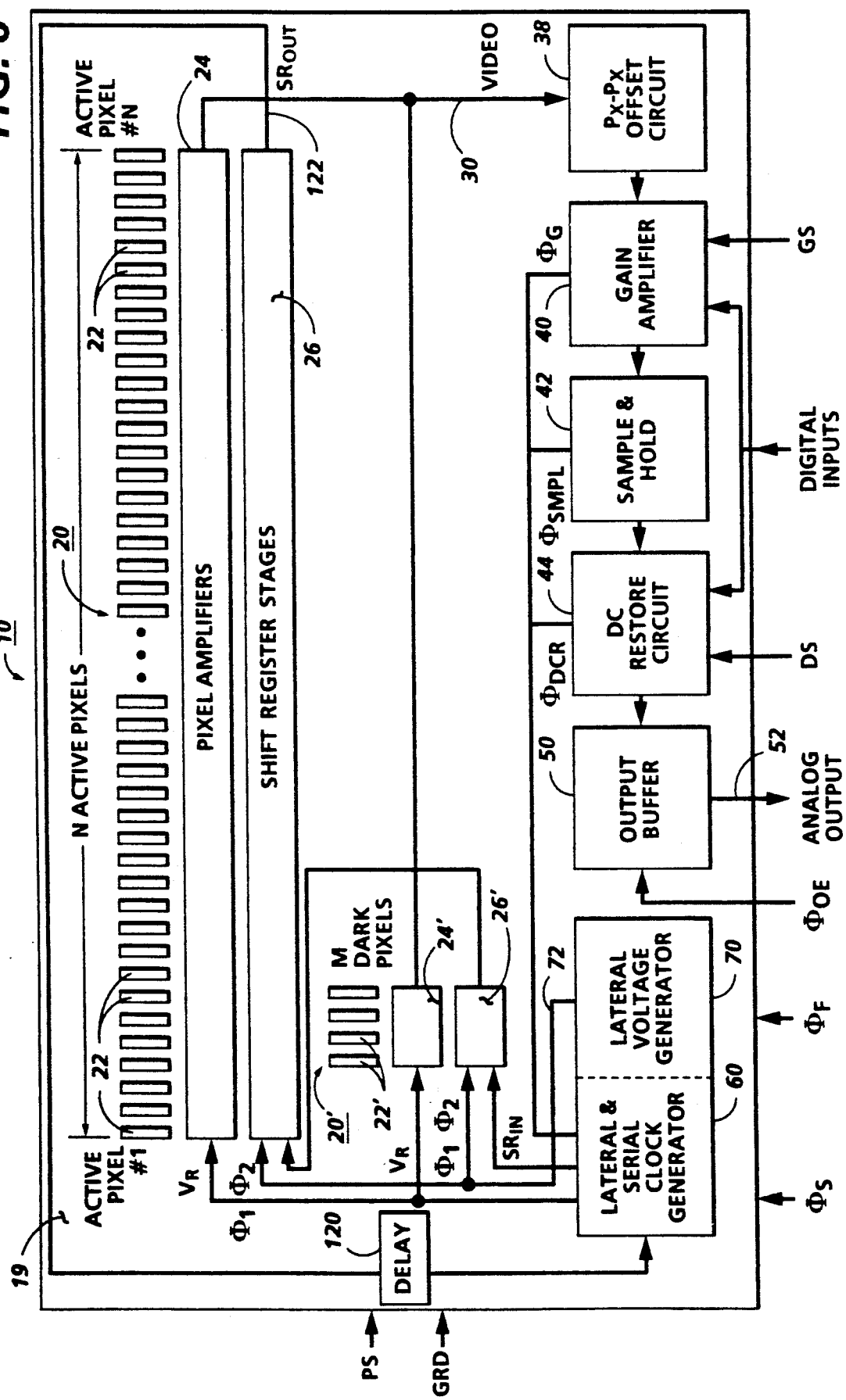

ARCHITECTURE FOR ANALOG AND DIGITAL IMAGE SENSOR ARRAYS

The invention relates to image sensor arrays, and more particularly to an improved architecture for both analog and digital sensor arrays which enables the array video signal processing circuits and other circuits to be integrated onto the array chip with the array sensors.

Current day image sensor arrays, such as the type used in document scanners for scanning image bearing documents and converting the images viewed to video signals, have supporting electronic circuitry such as analog buffers, DC restore circuits, A/D conversion circuits, clock circuits, etc. external to the sensor chip. This tends to increase the cost and complexity of the scanner, and thus it would be an advantage if all of these ancillary and supporting circuits could be co-located with the scanning array on the sample chip. The advantage achieved by placing the supporting circuits on the same chip as the sensor array becomes even more significant and important where the sensor array is intended to be joined with other like sensor arrays to form a larger or full width array since the number of individual parts that must be handled increases dramatically as the number of sensor arrays that are joined together increases.

In the prior art, U.S. Pat. No. 4,491,964 to Scanner discloses an OCR with separate sensor array block, delay stage block, black reference block, etc. U.S. Pat. No. 4,544,848 to Kawasaki et al discloses a photoelectric conversion device which can be formed as a single MOS integrated circuit with photoelectric conversion section, clock generating circuit, shunt switches, buffer, and comparator. U.S. Pat. No. 4,734,589 to Atherton discloses an apparatus with discrete blocks for directly converting an analog photodiode signal to digital form using a switched capacitor successive approximation A/D converter. U.S. Pat. No. 4,684,991 to Forchheimer et al discloses a device having an array of photodiodes arranged in a matrix, a picture processor allowing parallel signal processing, and a digital circuit on the same semiconductor substrate, while U.S. Pat. No. 4,174,528 to White discloses a scanner array comprised of a charge transfer device chip which includes an exposure control section and a document information receiving section. U.S. Pat. No. 4,281,254 to Seachman discloses a self-scanned photosensitive device having photosensor array, shift registers, transfer array, counter, and clock. An U.S. Pat. No. 4,914,311 to Kinoshita et al discloses a linear sensor formed on a single semiconductor chip having image sensing devices, charge transfer devices, and plural circuit elements located to provide uniform temperature distribution throughout the chip.

In contrast, the present invention provides an image sensor array architecture that provides a sensor array that may be used along or in end-to-end abutment with like sensor arrays to form a longer uninterrupted image scanning array for scanning images and converting the images to pixels while providing dark reference signals, comprising, in combination: a substrate; a first relatively long linear row of photosites integral with the substrate for scanning an image line and providing analog video signals representative of the images scanned; a second relatively short linear row of photosites integral with the substrate providing dark reference signals; the second row being parallel to and located within the boundaries of the first row to enable end-to-end abutment of the sensor array with other like sensor arrays while providing dark reference signals without using photosites in the first row whereby to avoid gaps in the longer uninterrupted image scanning array; and circuit means integrated onto the substrate for processing the analog video signals to provide pixels including a first circuit for offsetting the video signals to reduce signal non-uniformity; a second circuit for adjusting the gain of the video signals; a third circuit for sampling the video signals; and a fourth circuit for restoring a predetermined DC bias to the video signals.

A fifth circuit for performing A/D conversion may be added to provide a digital sensor array.

IN THE DRAWINGS

FIG. 6 is a schematic view of an alternate architecture in which a delay circuit is provided for synchronizing operation where plural sensor arrays are abutted together as shown in FIG. 3.

Figure 1:
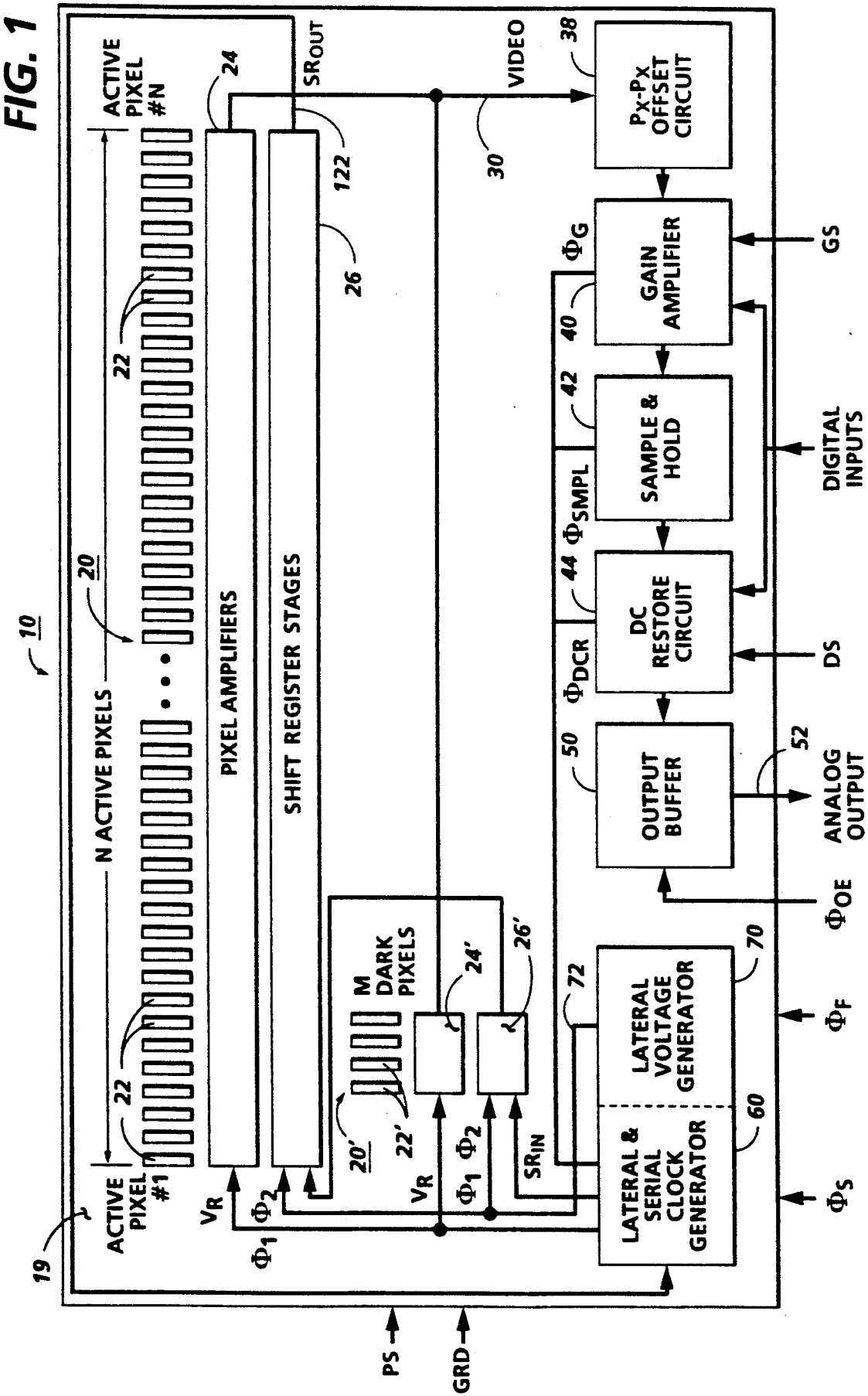
FIG. 1 is a schematic view illustrating the image sensor array architecture of the present invention for an analog sensor array.
Figure 2:
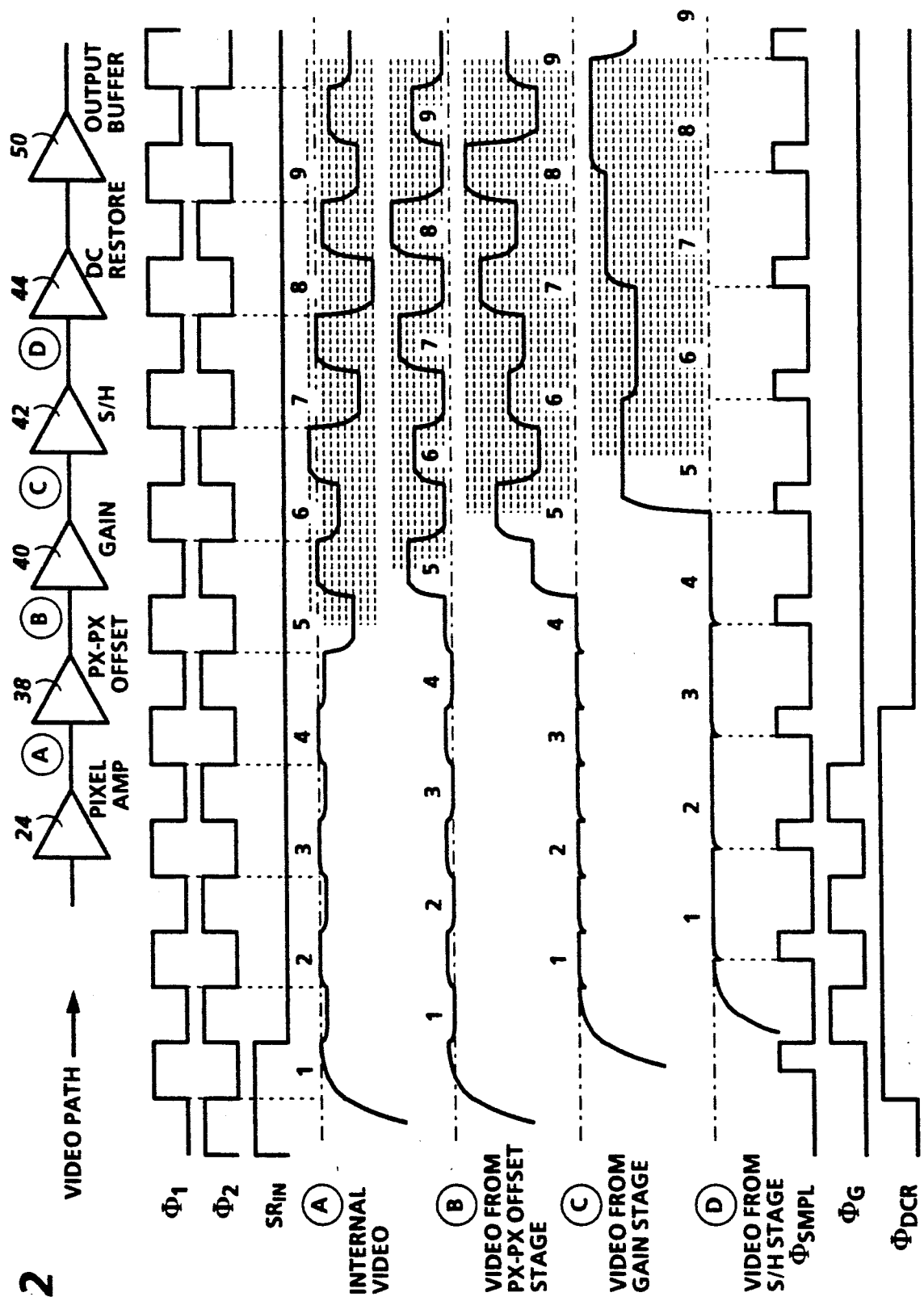
FIG. 2 is a timing diagram showing an example of the operating sequence of the analog sensor array shown in FIG. 1.
Figure 3:
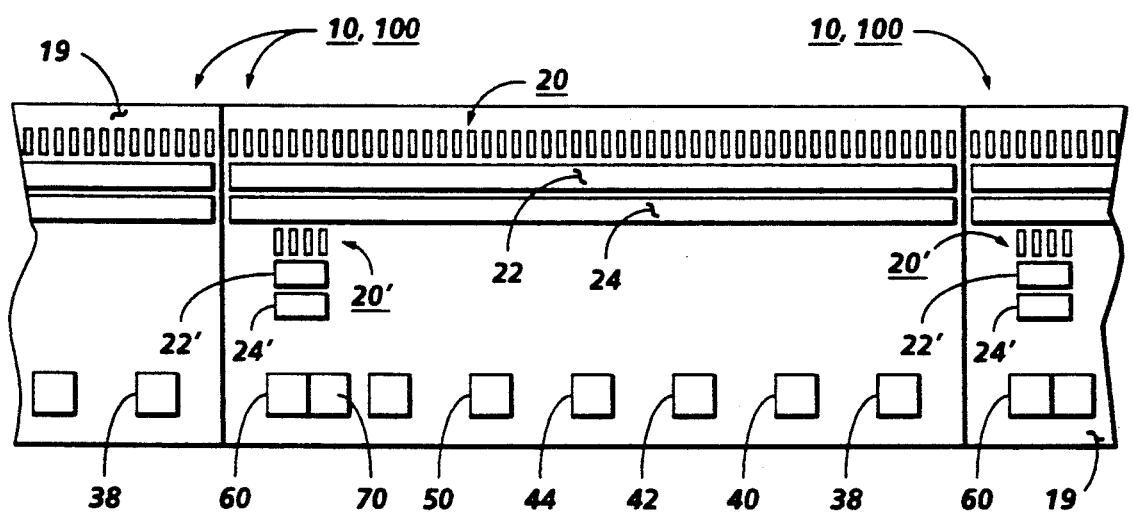
FIG. 3 is a block diagram showing the manner in which plural sensor arrays constructed in accordance with the architecture of FIG. 1 may be abutted together to form a longer or full width array.

Referring to FIGS. 1-3, the architecture for an analog image sensor array, designated generally by the numeral 10 of the present invention is there shown. While sensor array 10 may be used independently in a single sensor array application, such as a document scanner of the type wherein the document image is converted by the array to video image signals or pixels for various uses such as printing, fax, storage, etc., image sensor array 20 is also adapted for abutting with like sensor arrays to form a longer composite or full width array as shown in FIG. 3. As will appear, sensor array 10 incorporates on the array chip or substrate 19 itself the principle operating elements required for array operation to form a unitary sensor array in contrast to the current practice in which the array supporting circuits are external to the sensor chip.

Array 10 has a first linear array or row 20 of N photosites or sensors 22 formed on chip 19 together with adjoining rows of N amplifiers 24 and 2N shift register stages 26, there being one amplifier 24 and two shift register stages 26 for each sensor 22. A second smaller array or row 20' of M photosites or sensors 22' with corresponding rows of M amplifiers 24' and 2M shift register stages 26' is also formed on chip 19 below the first row 20. The entire chip is covered with a light shield except for sensors 22 of row 20. As will appear, sensors 22 of the first row 20, which are referred to herein as active sensors, serve to scan image lines and convert the images viewed to video signals, while sensors 22' of second row 20', which are referred to herein as inactive sensors, provide dark reference signals for use in calibrating and testing the array 10. By locating the second row 20' within the confines of the first row 20, gaps due to the presence of inactive sensors such as sensors 22' in the row of active sensors formed when plural sensor arrays 10 are abutted together to form a longer array as depicted in FIG. 3 are avoided.

Sensors 22' of second array 20' may be positioned in any convenient spot on chip 19. The linear axis of sensor row 20' may be parallel with that of sensor row 20, perpendicular to the linear axis of sensor row 20, or be in any other suitable angular relationship with sensor row 20. For single sensor array applications, row 20' of sensors 22' may be located along the same linear axis as row 20 of sensors 22.

Sensors 22 of array 10 scan in the normal manner with the video signals accumulated by the individual sensors during a timed integration period. At the end of the integration period, the video signals (and the dark signals on inactive sensors 22') are transferred to amplifiers 24, 24' respectively. The shift register stages 26, 26' connect the outputs of amplifiers 24, 24' to internal video line 30 serially. Normally, the calibration signals from inactive sensors 22' are read out first to enable calibration functions to be carried out before the video signals from the active sensors 22 are read out.

The analog video signals output to internal video line 30 undergo analog processing prior to input to an analog output buffer 50 from where the pixels are output to analog output line 52. Analog buffer 50 serves the drive large capacitive and/or conductive loads. For this, a series of analog signal processing circuits are provided. These comprise, in series, an offset reduction circuit 38 to reduce non-uniformity in the offset between sensors 22, gain amplifier circuit 40 to adjust signals gain, sample and hold circuit 42 to sample and hold the video signal output of the array constant, and DC restore circuit 44 to adjust the DC bias level on which the analog output of the sensor rides. Circuits 38, 40, 42, 44 are formed on and hence integral with chip 19.

To provide the requisite driving and clocking pulses for array 10, a Lateral & Serial clock generator 60 and Lateral Voltage Generator 70 is provided on chip 19. As more fully explained in copending application Ser. No. 07/787,338, filed Nov. 4, 1991 in the names of Jagdish C. Tandon et al to "Amplifier Offset Reduction System for Sensor Arrays" incorporated by reference herein, clock pulses output generator 60 include the various clocks for sensors 22, 22' such as $\Phi_1$, $\Phi_2$, $SR_{IN}$ etc. and for analog processing such as $\Phi_{SMPL}$, $\Phi_G$, $\Phi_{DCR}$, etc. Shift register return line 122 returns shift register clock pulses $SR_{OUT}$ to clock generator 60. Generator 60 is driven by a master clock input signals $\Phi_S$, the frequency of which determines the speed at which sensor array 10 will operate, and fence clock input $\Phi_F$, which controls the integration time of the sensors. Master clock input signals $\Phi_S$, fence clock $\Phi_F$, and output enable signal $\Phi_{OE}$, which enables the analog output of buffer 50 during the serial read time, are derived from the apparatus with which sensor array 10 is used, normally a document image scanner (not shown).

As best seen in the exemplary timing diagram of FIG. 2, shift register signals $\Phi_1$, $\Phi_2$ from clock generator 60 drive shift register stages 26, 26' to connect the amplifiers 24, 24' outputs serially to internal video line 30. During this period, new video signals from the next image line are collected by sensors 22 together with dark signals from sensors 22' during a timed integration period following which both sets of signals are transferred to the inputs of amplifiers 24, 24'. The shift register stages 26, 26' connect the amplifier output to video line 30. As the signals are output from shift register stages 26, the offset of each pixel is adjusted by offset reduction circuit 38 (B in FIG. 2) followed by gain adjustment by gain amplifier circuit 40 (C in FIG. 2). The adjusted video signals are thereafter sampled and held by circuit 42 (D in FIG. 2). The DC level of the signals is restored by DC restore circuit 44, and the final video signals output to analog buffer 50 for output as pixels to analog output line 52.

Voltage generator circuit 70 provides a reset voltage $V_R$ for resetting the sensors 22, 22' prior to start of the next integration period. Internal reset voltage line 72 couples voltage generator circuit 70 with pixel amplifiers 24.

Input bits $B_0$–$B_3$ are sued to adjust the sensor gain and/or DC restore level setting of gain amplifier circuit 40 and D.C. Restore circuit 44. To enable adjustment of the gain setting of gain amplifier circuit 40, a Gain Select pulse signals GS input is provided. To enable adjustment of the sensor DC level setting, a D.C. Select Level pulse signal DS input is provided. Signals PS and GRD are power input and ground return respectively.

Figure 4:
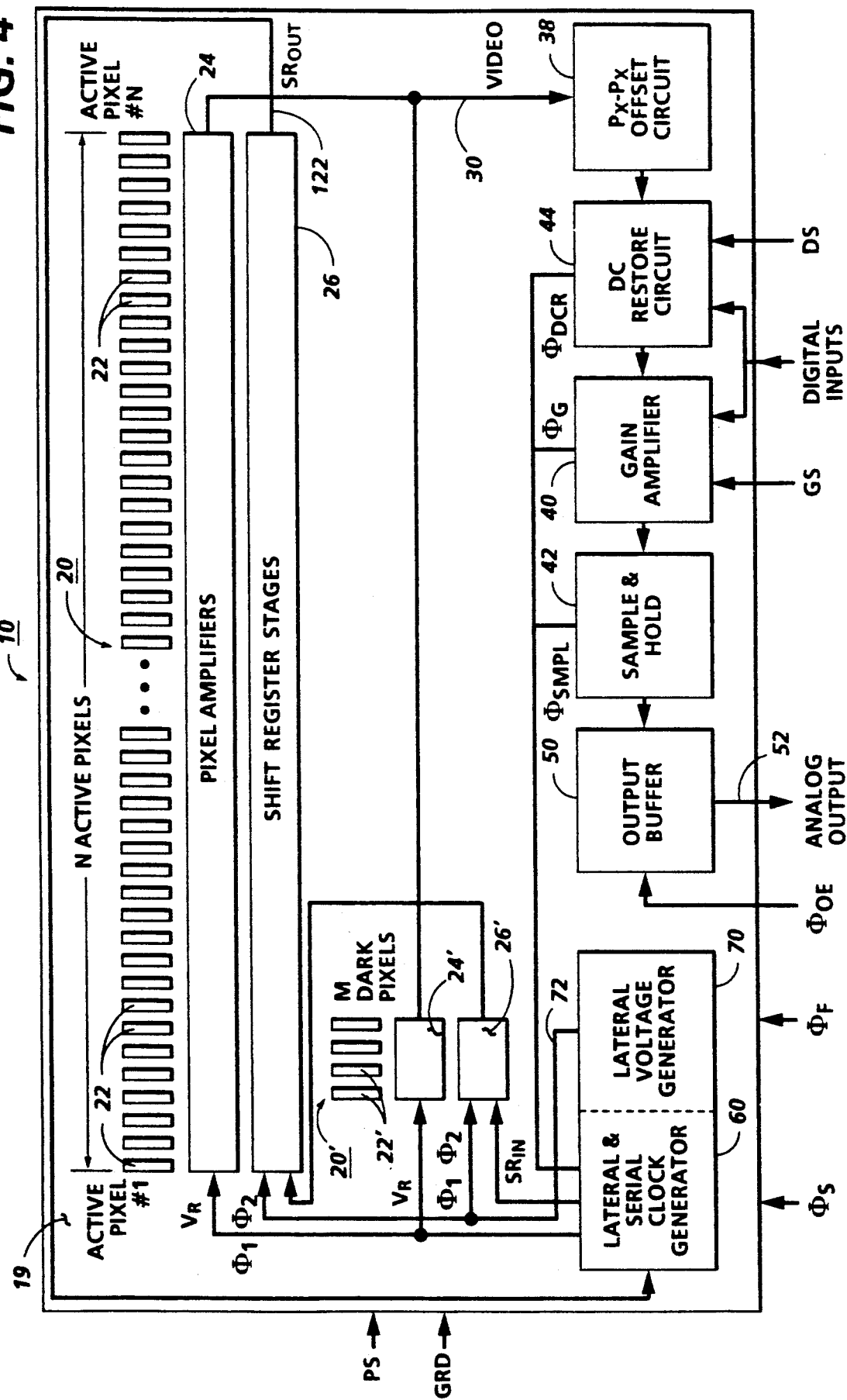
FIG. 4 is a schematic view illustrating an alternate analog sensor array architecture.

Referring now to FIG. 4, where like numbers refer to like parts, D.C. restore circuit 44 has in effect been moved to a position between Offset Reduction circuit 38 and Gain Amplifier 40. This enables D.C. restoration of the video signals output from Offset Reduction circuit 38 to be made prior to adjustment of the video signals gain.

Figure 5:
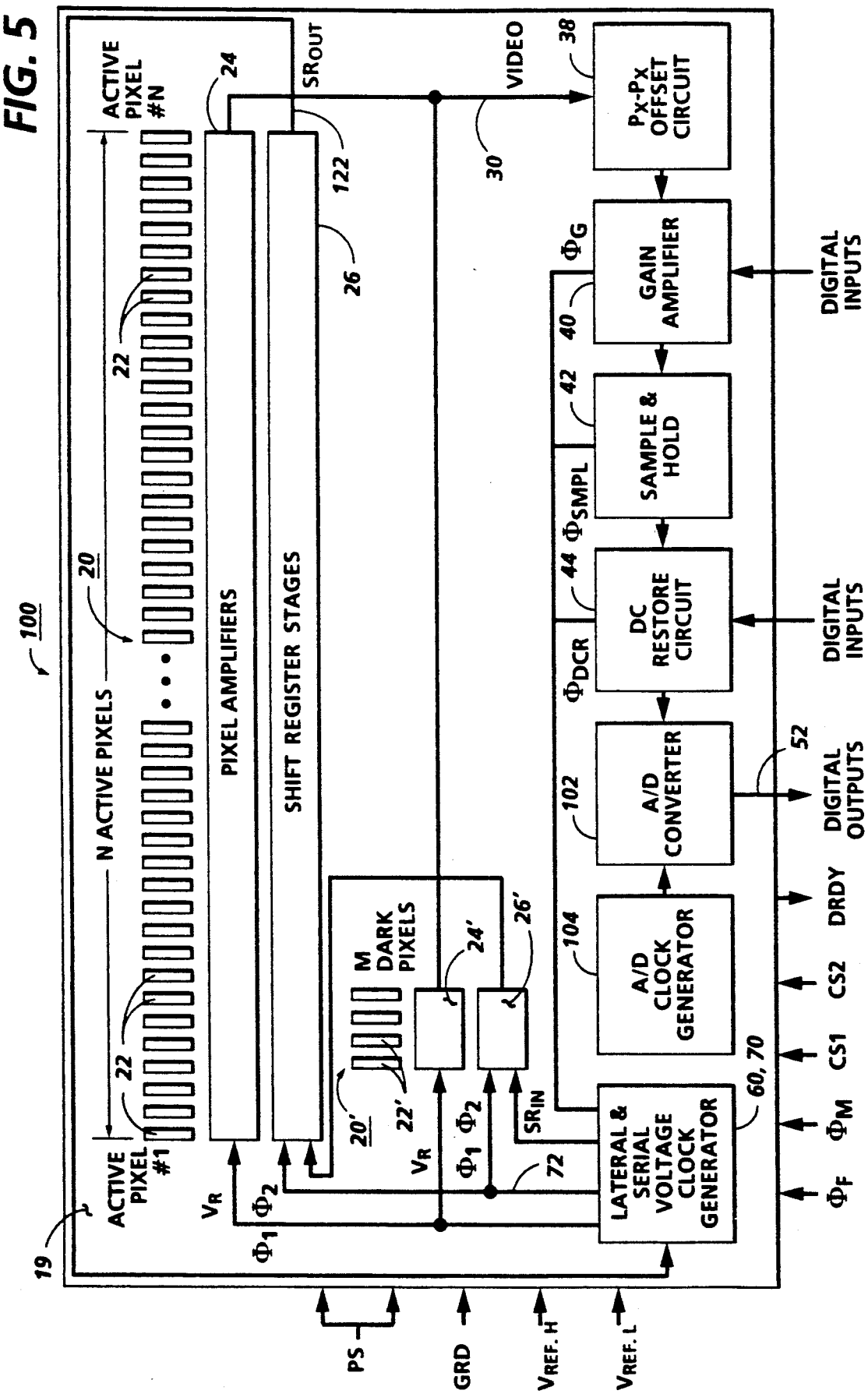
FIG. 5 is a schematic view illustrating an alternate sensor array architecture for a digital sensor array.

Referring now to FIG. 5, where like numbers refer to like parts, the sensor array architecture of the present invention may also be used to provide a digital sensor array 100. In this architecture, analog output buffer 40 is replaced by A/D converter 102 and an A/D clock generator 104 for driving A/D converter 102 provided. A/D converter 102 and A/D clock generator 104 are integral with chip 19. External Chip Select clock signal $C_{S1}$ to clock generator 104 is used, during the output mode, to enable and disable the output of A/D converter 107 while a second Chip Select clock signal $C_{S2}$ sets the operating mode of array 100 to either output or input mode. Chip Select signals $C_{S1}$, $C_{S2}$ are derived from the apparatus with which sensor array 100 is associated. Additional inputs $V_{ref\ H}$ and $V_{ref\ L}$ define the upper and lower limits of A/D converter's 102 range while PS and GRD are the power input and ground returns.

Basic operation of digital sensor array 100 is the same as that of analog array 10 except that the analog video signals, following processing by DC restore circuit 44, are output to A/D converter 102 where the analog signals are converted to digital to provide a digital pixel output to output lines 52. Digital sensor array 100 is adapted for abutting with like sensor arrays to form a longer composite or full width array in the manner depicted in FIG. 3 or array 100 may be used independently in a single sensor array application.

In the embodiment shown in FIG. 6, where like numbers refer to like parts, a delay circuit 120 which may comprise plural shift register stages, is provided in the shift register clock return line 122 ($SR_{OUT}$) of analog sensor array 10. Although not shown, a delay circuit 120 may be similarly applied to digital sensor array 100. Delay circuit 120 establishes a time gap between one sensor array and the next sensor array where plural sensor arrays 10 or 100 are abutted together to form a longer or full width array as depicted in FIG. 3.

It is understood that the order in which Gain Amplifier cirucit 40, Sample & Hold circuit 42, and DC Restore Circuit 44 are coupled together may be different than that shown and described herein. Further, that all of circuits 40, 42, 44 may not be necessary for certain applications. Additionally, it is understood that the waveforms depicted in FIG. 2 will be different for different sensor array constructions.

It is further understood that sensor arrays 10, 100 may be used as an independent sensor array without coupling to other like arrays.

While the invention has been described with reference to the structure disclosed, it is not confined to the details set forth, but is intended to cover such modifications or changes as may come within the scope of the following claims.

We claim:

1. A sensor array adapted for single chip applications or for end-to-end abutment with like sensor arrays to form a longer uninterrupted image scanning array for scanning images and converting said images to pixels while providing dark reference signals for array control purposes, comprising, in combination:
   a) a substrate;
   b) a first relatively long linear row of photosites integral with said substrate for scanning an image line and providing analog video signals representative to the images scanned;
   c) a second relatively short linear row of photosites integral with said substrate providing dark reference signals;
   said second row being located within the boundaries of said first row to enable end-to-end abutment of said sensor array with other like sensor arrays while providing dark reference signals without using photosites in said first row whereby to avoid gaps in said longer uninterrupted image scanning array; and
   d) circuit means integrated onto said substrate for processing said analog video signals to provide said pixels.

2. The sensor array according to claim 1 in which said circuit means includes
   1) first circuit means for offsetting said video signals to reduce signals non-uniformity;
   2) second circuit means for adjusting gain of said video signals;
   3) third circuit means for sampling and holding said video signals; and
   4) fourth circuit means for restoring a predetermined DC bias to said video signals.

3. The sensor array according to claim 1 in which said circuit means includes
   1) first circuit means for offsetting said video signals to reduce signal non-uniformity;
   2) second circuit means for restoring a predetermined DC bias to said video signals;
   3) third circuit means for adjusting gain of said video signals; and
   4) fourth circuit means for sampling and holding said video signals.

4. The sensor array according to claim 2 including analog buffer means coupled to the output of said fourth circuit means for driving large capacitive and/or conductive loads.

5. The sensor array according to claim 2 including analog-to-digital circuit means coupled to the output of said fourth circuit means for converting said analog video signals output said fourth circuit means to digital pixels.

6. The sensor array according to claim 1 including:
   delay circuit means for synchronizing said pixel output by said sensor array with the pixels output by other ones of said sensor arrays in said longer array.

7. The sensor array according to claim 3 including analog buffer means coupled to the output of said fourth circuit means for driving large capacitive and/or conductive loads.

8. The sensor array according to claim 3 including analog-to-digital circuit means coupled to the output of said fourth circuit means for converting said analog video signals output by said fourth circuit means to digital pixels.

9. The sensor array according to claim 1 in which said second row of photosites is parallel to said first row of photosites.

10. The sensor array according to claim 1 in which said second row of photosites is perpendicular to said first row of photosites.

11. The sensor array according to claim 2 including fifth circuit means for converting said analog video signals to digital video signals.

12. A unitary sensor array adapted for single chip application or end-to-end abutment with like sensor arrays to form an uninterrupted composite image scanning array, said sensor array scanning images and converting said images to image signals, comprising in combination:
    a) a substrate;
    b) a relatively long linear array of photosites integral with said substrate providing analog image signals representative of the image scanned; and
    c) analog circuit means integrated onto said substate for processing said signals to provide a pixel output including
       1) a first circuit for offsetting said signals to reduce non-uniformity between said signals;
       2) a second circuit for adjusting signal gain to a preset level;
       3) a third circuit for sampling and holding the signal sample; and
       4) a fourth circuit for inputting a predetermined DC carrier voltage to said signals;
    said first, second, third, and fourth circuit cooperating to provide said pixel output.

13. The sensor array according to claim 12 including a second relatively short linear array of photosites integral with said substrate providing dark analog reference signals.

14. The sensor array according to claim 13 in which said second array is located within the confines of said first array to enable end-to-end abutment of said sensor array with other like sensor arrays while providing said dark reference signals without using photosites in said first array whereby to avoid gaps in said composite image scanning array.

15. The sensor array according to claim 13 in which said second row of photosites is parallel to said first row of photosites.

16. The sensor array according to claim 13 in which said second row of photosites is perpendicular to said first row of photosites.

17. The sensor according to claim 12 including buffer means coupled to said fourth circuit.

18. The sensor array according to claim 12 including analog-to-digital circuit means coupled to said fourth circuit for converting said analog image signals to digital to provide a digital pixel output.

19. The sensor array according to claim 12 including delay circuit means to enable the pixel output of said sensor array to be synchronized with the pixel output of other ones of said sensor arrays when said sensor array is abutted with other like sensor arrays to form said longer array.

20. The sensor array according to claim 6 including buffer means for temporarily holding said pixel output from said first and second arrays.

21. The sensor array according to claim 13 including analog-to-digital circuit means for converting said analog image signals of said first array to digital to provide a digital pixel output.

22. The sensor array according to claim 14 including delay circuit means to enable said pixel output of said sensor array to be synchronized with the pixel output of other ones of said sensor arrays when said sensor array is abutted with other like sensor arrays to form said longer array.

23. A unitary sensor array adapted to end-to-end abutment with like sensor arrays to form an uninterrupted composite image scanning array for scanning images and converting said images to image signals, comprising in combination:
 a) a substrate;
 b) a relatively long linear array of photosites integral with said substrate providing analog image signals representative of the image scanned; and
 c) analog circuit means integrated onto said substrate for processing said signals to provide a pixel output including
  1) a first circuit for offsetting said signals to reduce non-uniformity between said signals;
  2) a second circuit for inputting a predetermined DC carrier voltage to said signals;
  3) a third circuit for adjusting signal gain to a present level; and
  4) a fourth circuit for sampling and holding the signal sample;
 said first, second, third, and fourth circuits cooperating to provide said pixel output.

* * * * *